United States Patent [19]
Morgan

[11] Patent Number: 5,958,647
[45] Date of Patent: Sep. 28, 1999

[54] THERMOSENSITIVE ETCH RESIST FOR FORMING A MASK

[76] Inventor: David A. Morgan, 13780 N. Manning Trail, Stillwater, Minn. 55144-1000

[21] Appl. No.: 08/858,977

[22] Filed: May 20, 1997

[51] Int. Cl.⁶ ........................................... G03C 1/73
[52] U.S. Cl. ...................... 430/270.1; 430/281.1
[58] Field of Search ............... 430/270.1, 281.1

[56] References Cited

U.S. PATENT DOCUMENTS

| | | | |
|---|---|---|---|
| 2,760,431 | 8/1956 | Beatty | 101/149.2 |
| 3,103,881 | 9/1963 | Grieshaber | 101/149.2 |
| 3,156,183 | 11/1964 | Bach | 101/149.2 |
| 3,168,864 | 2/1965 | Branal et al. | 101/149.2 |
| 3,700,458 | 10/1972 | Lindholm | 96/114.1 |
| 4,081,572 | 3/1978 | Pacansky | 427/53 |
| 4,210,711 | 7/1980 | Kitajima et al. | 430/325 |
| 4,725,534 | 2/1988 | Kagami et al. | 430/619 |
| 5,025,266 | 6/1991 | Shimamura et al. | 346/1.1 |
| 5,328,811 | 7/1994 | Brestel | 430/325 |
| 5,512,418 | 4/1996 | Sheau-Hwa Ma | 430/271.1 |
| 5,533,452 | 7/1996 | Mouri et al. | 430/302 |
| 5,569,573 | 10/1996 | Takahashi et al. | 430/138 |
| 5,663,032 | 9/1997 | Fukui et al. | 430/281.1 |

FOREIGN PATENT DOCUMENTS 0 763 425  3/1997  European Pat. Off. .

OTHER PUBLICATIONS

Translation of: "Bridges of Ions in Macro Molecular Networks" By Hans J. Kuhn and W. Gerhard Pohl, Item 923, Helvetica Chimica Acta, (1965).
Data Sheet of Creo Products Inc. Trendsetter®, Model 3244 Thermal Plate Setter (1995).
Data Sheet of MacDermid Metex Ultra Etch®, (May 29, 1996).

*Primary Examiner*—Maria Nuzzolillo
*Assistant Examiner*—Laura Werner
*Attorney, Agent, or Firm*—Steven G. Lisa; William J. Hallihan

[57] ABSTRACT

A thermosensitive resist used in the manufacturing of printed circuit boards comprising a mixture of polyacrylic acid, a salt of a long chain fatty acid such as silver behenate, an infra-red absorber and modifiers such as additional polymers. In the unheated form the resist can be easily washed away with water-based mild solutions or pure water. When selectively heated by an IR laser a non-soluble, etch resistant composition is formed protecting the copper clad printed circuit board from the etchants used in the process.

22 Claims, No Drawings

THERMOSENSITIVE ETCH RESIST FOR FORMING A MASK

FIELD OF INVENTION

The invention relates to the manufacturing of printed circuit boards and more specifically to the use of a thermosensitive resist, instead of photoresist. Other fields of use are the manufacturing of Multi-Chip-Modules (MCM) and Flat Panel Displays (FPD).

BACKGROUND OF THE INVENTION

In the process of manufacturing electronic printed circuit boards (PCB) and similar articles, such as Multi-Chip-Modules (MCM) and Flat Panel Displays(FPD), a layer requiring selective etching needs a protective coating from the non-etched areas. The best known resists are photoresists, widely used in the PCB, MCB, FPD and semiconductor industries. Selected areas of the resist have to be removed in order to allow the etching process. After etching, the remaining resist is removed from the protected areas, in a process known as "stripping". The common way of selectively removing the resist is by changing its solubility, via selective exposure. The exposure can be done via a mask (contact or projection printing) or by direct writing using a laser. The current invention is most suitable to the direct writing with an IR laser. Depending on the type of resist used (positive or negative), the laser exposed area becomes more soluble or less soluble in a liquid known as a "developer". After developing, the soluble areas of the resist are removed and the article can be selectively etched. In this context the current invention is a "negative acting thermoresist".

A chemical composition capable of switching from a water soluble or water washable state to an insoluble state when heated, preferably by a focused IR laser, has been discovered. The degree of solubility can be controlled over a wide range by mixing the composition with different polymers. Such compositions are of greater commercial importance in the manufacturing of printed circuit boards, replacing the current UV exposed photoresist with IR exposed thermosensitive resists. The IR exposure allows faster and environmentally cleaner imaging as development can be done with plain water. In this disclosure the terms "water soluble" and "water washable" are used interchangeably to describe the ability of the unexposed polymer to be washed away by water, regardless of the exact nature of the action of water or water base solution on the polymer.

Prior art thermosensitive resists required a multi-step or multi-layer process which was not cost effective. The process of manufacturing printed circuit boards using a single layer thermoresist is covered by a co-assigned application, 08/653,901,now abandoned.

BRIEF DESCRIPTION OF THE INVENTION

In accordance with the invention, a water soluble polymer is made to react with a metallic salt of a long chain fatty acid. As long as the mixture is not heated it is water soluble due to the water soluble polymer. After heating, the water soluble polymer reacts with the metallic salt to form a highly insoluble polymer. While it is believed to be the nature of the reaction, the invention should not be constrained by any explanation used in the disclosure. In order to make the composition compatible with imagewise heating using lasers, an absorber for the specific laser wavelength used has to be added. Absorbers can be broadband (covering a wide range of wavelengths) such as carbon powder, or dyes tuned to specific lasers (e.g. laser diodes).

In the most basic form, the invention contains only these three ingredients (water soluble polymer, salt of fatty acid, and laser absorber). In this form the unexposed areas are highly water soluble. After heating with a laser, the exposed areas become highly hydrophobic and insoluble. The insoluble layer acts as an etch resistant layer, resisting common copper etchants such as $FeCl_3$.

The composition is very tolerant to many additives which can be used to modify the etch resistance, solubility, adhesion, coating ease, etc. One of the more useful additives is a second polymer such as polyvinyl butyral. It increases the resistance to alkaline etchants.

DETAILED DESCRIPTION OF THE INVENTION

A thermosensitive composition switching from a water soluble state to an insoluble state is based on the reaction between a water soluble polymer and a metallic salt of a long chained fatty acid. The length of carbon chain of the fatty acid is critical. Short fatty acid salts are too reactive, and will react with the water soluble polymer at room temperature.

Very long fatty acids will not react at all. The invention requires a composition which has a long shelf life at room temperature (up to years) while reacting in a few millionths of a second at temperatures of a few hundred degrees celsius. The requirement for very fast reaction time at elevated temperatures stems from the need to imagewise expose a thin layer of the composition using a focused laser beam. The small size of the laser beam, typically 2–20 microns, causes the dwell time of the beam on any given spot to be extremely brief, in the range of 0.2–5 microseconds. It was found out that only fatty acids with a carbon chain length from about 18 to 24 carbon atoms perform well. The rate of reaction at a given temperature can also be modified by the molecular weight of the water soluble polymer as well as by adding other polymers to the composition. The ratio of the ingredients also affects the rate of the reaction. These effects are secondary compared to the dominant effect of the carbon chain length of the fatty acid.

The best results were obtained by using polyacrylic acid as the water soluble polymer and silver behenate as the metallic salt of the fatty acid, with polyvinyl butyral as a modifying polymer. The modifying polymer controls the degree of water solubility of unexposed areas as well as the resistance to etchants of the exposed area. The phrase "water solubility" does not only refer to solubility in pure water but in many aqueous solutions, as long as they are not sufficiently active to change the composition. The term "water solubility" in the context of this invention should be interpreted as solubility in the water based developers which contain alkaline solutions as well as solubility in detergent and in plain water. In general, this invention requires, by far, less chemicals added to the water used to wash away the unexposed areas than existing photoresists. As the case is for any solvent, the solubility is also strongly affected by temperature.

The uniqueness of the invention lies in the very sharp switching of the solubility found in this reaction and the versatility of the reaction due to its high tolerance to additives. This high tolerance allows it to tailor the properties of the composition by adding relatively large amounts of other polymers and additives such as absorbers, surfactants and adhesion promoters. In the following examples the solvent used is ethanol, but other solvents can be used as well. The solvent fully evaporates after application of the composition, thus is not part of the reaction. Different solvents, such as ethanol/water mixes or pure water can be used. In most applications, the composition is applied by dip coating, roller coating, knife coating or spraying to a thickness of 0.5–5 microns. In order to absorb sufficient amounts of laser power in such a thin layer, a strong absorber is required, as the composition is non-absorbent in the visible or IR part of the spectrum. Many dyes and pigments were tested and the composition works with all of them. The best performing absorbers for the near IR were IR dye ADS830 made by American Dye Source (N.J.); Lamplack Carbon Powder from Fisher Scientific Supplies and WS830 from Zeneca (U.K.), which is a water soluble IR dye. In all the following examples the word "IR Absorber" should be interpreted as one of these absorbers. The invention, of course, is not limited to any absorber and works well even without an absorbent if the heat is applied directly by conduction or convention instead of by radiation. By the way of example, the composition can be used without an absorbent if it is coated onto a substrate which absorbs the laser radiation, heating up the coated layer by conduction. Another application where an absorber is not required is when the heat is applied by an array of resistive elements, similar to thermographic paper.

The versatility of the invention is illustrated by the following examples. As is the case for all thermosensitive compositions, it is sometimes desired to add an indicator dye permanently changing color with temperature, to generate a visible image of the imagewise exposed areas for the purpose of verification. One manner of creating a more visible image using the present invention is the use of a reducing agent to reduce the silver behenate to metallic silver, creating a dark image of the exposed areas. Such reduction of silver behenate to produce a visible image is disclosed in U.S. Pat. Nos. 3,168,864 and 3,103,881 and need not be detailed here. Note that while these prior art compositions use silver behenate, they use it to form the visible image and not as the key for the solubility switching.

EXAMPLE 1A–1B

A dry sample of silver behenate is mixed with ethanol and a 7% solution of polyacrylic acid. It is ball milled for 24 hours using 12 mm balls. If carbon absorber is used (example 1A), it is mixed with the above ingredients before ball milling. If an IR dye is used (example 1B), it is mixed only after ball milling due to the short shelf like of the IR dye. The quantities are as follows:

3 grams silver behenate (available from Aveka Inc. Woodbury, Minn.)

1 gram polyacrylic acid (14.3 grams of 7% solution, available from Scientific Polymer Products, N.Y.)

Note: the polyacrylic acid has a typical molecular weight of 450,000.

1 gram absorber (carbon in example 1A or ADS830 in example 1B)

100 grams ethanol.

A copper clad inner layer of a multi-layer printed circuit board is coated by dipping into the solution and air drying. Dry thickness of the coating is about 1.5 microns. Copper thickness is about 30 microns. It is exposed with a Creo Products Inc. (B.C., Canada) Trendsetter® thermal platesetter at an energy of 600 mJ/cm$^2$, wavelength of 830 nm and resolution of 3200 dpi. After exposure the plate is washed with warm water using very light scrubbing to remove the unexposed area and with an FeCl$_3$ solution at 60° C. for two minutes. Clean etching was achieved. After etching, the thermoresist is stripped with a commercial photoresist stripper, using alkaline stripping solution.

EXAMPLE 2A–2B

Same as example 1A–1B with the addition of 1 gram of polyvinyl butyral (14.3 grams of a 7% solution, material available from the Monsanto Corp., St. Louis, Miss., type B72). Material is coated and exposed under same conditions as in example 1A–1B. This formulation is more resistant to alkaline etchants, such as warm NH$_4$OH based etchants. The disadvantage of 2A–2B over 1A–1B is that the unexposed areas are more difficult to wash off. The formulation of 2A–2B withstood a commercial NH$_4$OH based acid (McDermid Metex®) better than example 1A–1B.

EXAMPLE 3A–3B

Same as example 1A–1B, but the ratio of polyacrylic acid to silver behenate is changed to increase solubility of the unexposed areas. The ratio is:

4 grams silver behenate 2 grams polyacrylic acid 1 gram absorber 100 grams ethanol In this example the solubility of the unexposed area is greater than example 1A–1B, without significantly affecting the insolubility of the heated areas. The higher solubility enables the use of the plain water to wash away the unheated areas. It can also be used without requiring an intermediate step of washing by using the water based etchant to wash away the unexposed areas. It was etched with FeCl$_3$, at 60° C. without washing the unexposed areas using agitation of the etchant.

EXAMPLE 4

This is prepared in the same manner as example 1A–1B, but without using any solvent except water. The ratio is:

3 grams silver behenate 4 grams 25% solution of polyacrylic acid in water, molecular weight of about 240,000 (Goodrich K702)

1 gram Zeneca WS830 water soluble dye (from Zeneca Specialty Chemicals, UK)

100 grams water

This is used as in example 1A–1B. The no solvent, all waterborne process, is important for environmental considerations as well as cost savings since a water solution of polyacrylic acid is significantly lower in cost than purified acid.

EXAMPLE 5

Same as example 4 except for sodium salt of polyacrylic acid (molecular weight about 5800) is used instead of polyacrylic acid.

EXAMPLE 6

Same as example 1A–1B except iron stearate is used instead of silver behenate. Reaction is similar but performance is lower, with solubility change not as robust as achieved in example 1A–1B.

Having described the present invention, with reference to those specified embodiments, it is understood that numerous variations can be made without departing from the spirit of the invention and it is intended to encompass such reasonable variations or equivalents within its scope.

What is claimed is:

1. An etch resist used to form a protective mask during a selective etching process of printed circuit boards and similar articles,
   said etch resist comprising a thermosensitive composition having a first and a second state;
   said thermosensitive composition in said first state comprising a water washable composition stable at room temperature;
   said thermosensitive composition in said second state further comprising a water resistant composition attained when said thermosensitive composition is selectively exposed to temperature greater than room temperature; said water resistant state being resistant to copper etchants comprising $FeCl_3$;
   said thermosensitive composition further comprises a water soluble polymer and a metallic salt of a fatty acid having a chain of between 10 to 30 carbon atoms.

2. The etch resist of claim 1 wherein said water soluble polymer of said thermosensitive composition is polyacrylic acid and said metallic salt is silver behenate.

3. The etch resist of claim 2 comprising between approximately a two to one and approximately a three to one ratio (by weight) of silver behenate to polyacrylic acid.

4. The etch resist of claim 3 further comprising polyvinyl butyral in approximately equal parts (by weight) to the polyacrylic acid.

5. The etch resist of claim 1 wherein the water resistant state is resistant to copper etchants comprising $FeCl_3$ in a solution at 60° C.

6. The etch resist of claim 5 wherein the water resistant state is resistant to copper etchants comprising $FeCl_3$ in an agitated solution at 60° C.

7. The etch resist of claim 5 further comprising an alkaline resistive additive.

8. The etch resist of claim 7 wherein the alkaline resistive additive is polyvinyl butyral.

9. The etch resist of claim 8 further comprising an ethanol based solvent.

10. The thermosensitive etch resist of claim 8 further comprising a water based solvent.

11. The etch resist of claim 1 wherein an area of the resist not exposed to temperature greater than room temperature and that is in the water washable composition state is washed away with an etchant that also etches a surface area of the printed circuit board previously covered by the water washable composition state thus not requiring an intermediate processing step between heating and etching.

12. The etch resist of claim 1 wherein the metallic salt of a fatty acid has a chain of between 18 and 24 carbon atoms.

13. The etch resist of claim 1 wherein the water soluble polymer is polyacrylic acid and the metallic salt is iron stearate.

14. The etch resist of claim 1 wherein the resist is a negative acting thermoresist.

15. The etch resist of claim 1 wherein said thermosensitive composition in the second state comprises the water resistant composition attained when selectively exposed to heating with a laser.

16. An etch resist as claimed in claim 1 wherein said exposure to temperature is performed by imagewise exposing said resist using an infra-red laser and said resist further comprises an absorber capable of absorbing radiation of said laser.

17. An etch resist forming a protective coating on a surface subjected to selective exposure to heat comprising:
    a thermosensitive material capable of switching from a soluble state to an etch resistant protective mask when heated briefly, said etch resistant protective mask being resistant to copper etchants comprising $FeCl_3$, and without requiring a prior or subsequent exposure to energy, the etch resist comprises; (i) a metallic salt of a fatty acid having a chain of between 10 to 30 carbon atoms; (ii) a water soluble polymer; and (iii) a laser absorber capable of absorbing the radiation from a laser.

18. An etch resist as claimed in claim 17 wherein said heating is performed by imagewise exposing said resist using an infra-red laser.

19. The etch resist of claim 18 wherein the absorber is a carbon absorber.

20. The etch resist of claim 18 wherein the absorber is a IR dye absorber.

21. The etch resist of claim 17 wherein said water soluble polymer is polyacrylic acid and said metallic salt is silver behenate.

22. The etch resist of claim 21 wherein the resist is applied to a surface comprising a circuit board and wherein the resist not exposed to heating with a laser in the soluble state is washed away with an etchant that etches a surface previously covered by the resist in the soluble state.

* * * * *